US008687269B2

(12) United States Patent
Robertson et al.

(10) Patent No.: US 8,687,269 B2
(45) Date of Patent: Apr. 1, 2014

(54) OPTO-ELECTRONIC DEVICE

(75) Inventors: Michael Robertson, Ipswich (GB); Xin Chen, Ipswich (GB); Paul Cannard, Ipswich (GB)

(73) Assignee: The Centre for Integrated Photonics Limited, Ipswitch (GB)

( * ) Notice: Subject to any disclaimer, the term of this patent is extended or adjusted under 35 U.S.C. 154(b) by 0 days.

(21) Appl. No.: 13/572,587

(22) Filed: Aug. 10, 2012

(65) Prior Publication Data
US 2013/0033743 A1 Feb. 7, 2013

Related U.S. Application Data

(63) Continuation of application No. PCT/GB2011/050255, filed on Feb. 11, 2011.

(30) Foreign Application Priority Data

Feb. 12, 2010 (GB) .................................. 1002391.9

(51) Int. Cl.
*H01S 5/30* (2006.01)

(52) U.S. Cl.
USPC ........................................................ 359/344

(58) Field of Classification Search
USPC ........................................................ 359/344
See application file for complete search history.

(56) References Cited

U.S. PATENT DOCUMENTS

| 5,929,426 | A * | 7/1999 | May ................................ 235/475 |
| 8,179,592 | B2 * | 5/2012 | Tanaka ............................ 359/344 |
| 2005/0092979 | A1 * | 5/2005 | Han et al. ........................... 257/9 |
| 2007/0047068 | A1 | 3/2007 | Tanaka et al. |
| 2009/0237780 | A1 | 9/2009 | Tanaka |

FOREIGN PATENT DOCUMENTS

| EP | 1760851 A2 | 3/2007 |
| JP | 2009-224691 A | 10/2009 |

OTHER PUBLICATIONS

International Search Report and Translation received in Patent Cooperation Treaty Application No. PCT/GB2011/050255, mailed May 2, 2011, 4 pages.
Written Opinion received in Patent Cooperation Treaty Application No. PCT/GB2011/050255, mailed May 2, 2011, 10 pages.
Khurgin, Jacob B., "Improvement of the Efficiency of Laser Cooling Using Type II Multiple QW's," Conference on Lasers and Electro-Optics, May 5-11, 2007, 2 pages.
Matsui, Yasuhiro, et al., "Novel Design Scheme for High-Speed MQW Lasers with Enhanced Differential Gain and Reduced Carrier Transport Effect," IEEE Journal of Quantum Electronics, vol. 34, No. 12, Dec. 1998, pp. 2340-2349.
Ru, G., et al., "Spatially-Indirect Photo- and Electro-Luminescence in the 1.3 μm Range at Room Temperature," Conference on Lasers and Electro-Optics, May 20-21, 2004, pp. 74-76.
Japanese Notice of Reasons for Rejection received on Application No. 2012-552473, mailed Oct. 8, 2013, 4 pages.

* cited by examiner

*Primary Examiner* — Mark Hellner
(74) *Attorney, Agent, or Firm* — Slater & Matsil, LLP

(57) ABSTRACT

An optical amplifier has a low polarization dependent gain. The amplifier includes a gain medium including a plurality of adjoining semiconductor layers to provide optical gain wherein the adjoining semiconductor layers define one or more quantum wells for electrons and are operative to provide both direct and indirect electron-hole transitions in the gain medium. A first quantized electron energy level in the conduction band and a first quantized hole energy level in the valence band is located in a first layer. A further first quantized hole energy level in the valence band is located in an adjacent second layer.

21 Claims, 10 Drawing Sheets

OPTO-ELECTRONIC DEVICE

This application is a continuation of International Application No. PCT/GB2011/050255, filed Feb. 11, 2011, which claims priority to Great Britain Application No. 1002391.9, filed Feb. 12, 2010, both of which applications are incorporated herein by reference.

TECHNICAL FIELD

The present invention relates to semiconductor devices. In particular the invention relates to optoelectronic devices that require polarization independence such as a Semiconductor Optical Amplifier (SOA).

BACKGROUND

Networks that utilize optical fiber as a data transmission medium in practice suffer from light attenuation as the light travels down the optical fiber, for example, standard SMF-28™ single mode fiber has an attenuation around 0.2 dB/km at a wavelength of 1550 nm. Therefore, it is common in many networks to incorporate electronic amplifiers at intermediary points along the fiber span. More recently, networks have used optical amplifiers that amplify the light optically without converting the input stream to an electrical signal. There are a number of wavelength ranges of operation in optical networks, principally determined by the low loss transmission spectral regions in glass optical fiber. These ranges have been standardized into a number of bands where two of the most commonly used are the O band (1260-1360 nm, nominally known to be centered around 1310 nm) and the C band (1530-1565 nm, nominally known to be centered around 1550 nm).

The optical fiber commonly used in networks is often of a type that does not preserve the polarization of light that was originally input into the fiber and as such the light that enters an amplifier after propagating along a length of optical fiber can have a random polarization. It is therefore desirable to have optical amplifiers with high optical gain but also low polarization dependence so that the amplifier amplifies the input light by the same amount regardless of the input polarization.

Semiconductor devices are increasingly being used in photonic networks to provide all-optical functionality because of their small size, low cost, capability for bulk manufacture, and ability to be monolithically or hybrid integrated into complex chip designs. A common semiconductor device used to amplify light is a Semiconductor Optical Amplifier (SOA). The SOA usually has a similar structure to a conventional semiconductor laser diode whereby the SOA comprises an optical waveguide to accept input light and output amplified light, a gain medium to provide the optical gain (often termed an active region), and electrodes to pump electric current through the gain medium. The SOA is typically used to receive an input signal from one facet of the device, amplify the input signal and output the amplified signal from either the same device facet (for example a reflective SOA) or a different device facet. An SOA can also be used as an ASE (Amplified Spontaneous Emission) source of light. Typically the gain medium is contained within the optical waveguide. There are many designs of SOA gain medium/waveguides, however those commonly used for high current injection efficiency typically have a buried hetero-structure (BH) waveguide similar to that shown in FIG. 1 or a ridge waveguide (RW) structure similar to that shown in FIG. 2.

A key parameter in the design of an SOA is the minimization of the Polarization Dependent Gain (PDG). To achieve this it is necessary to balance the modal gains (G) for both the transverse electric mode (TE) and transverse magnetic mode (TM). The modal gain for either polarization mode is typically defined as $G=g*r$, where g is the material gain, and r the confinement factor of the mode for the polarization state. The confinement factor is the proportion of the optical mode that travels in the gain medium. The PDG is the difference between G(TE) and G(TM). Other key parameters in the design of an SOA include low noise and a wide spectral bandwidth of operation. It is also important that the growth conditions and other processing parameters used to make a device with the aforementioned effects such as low PDG are easily controllable and repeatable so that a good device yield can be easily achieved.

P. Doussiere et al., IEEE Photonics Technol. Lett., vol. 6, pp. 170-172, 1994, describes an optical amplifier where the gain medium had a square cross section. The TE and TM confinement factors for an active layer with a square cross section are nominally identical, thus making the gain for both polarization states equal. However, a device with a square gain medium has poor current injection efficiency and thus is generally not suitable for use as an amplifier.

To achieve efficient current injection in both BH and RW designs, it is preferable for the device to comprise a gain medium with an asymmetric cross section wherein the cross sectional width is greater than the thickness. It is also desirable that this cross sectional asymmetry exists over most or all of the SOA waveguide length.

For a gain medium with a wide and thin asymmetric cross section, the confinement factor of the TE mode is substantially larger than that of the TM mode, thus the gain for the TE mode is nominally higher than the TM mode. The exact values of the confinement factors are determined (usually using numerical calculation software) by the waveguide geometry and material refractive indices of the layers used. It is therefore not possible to realize efficient semiconductor devices with low PDG using waveguide geometry alone.

There have been several previous attempts to provide different material gains for the TE and TM modes to compensate for the PDG arising from the cross sectional asymmetry of the gain medium. One approach to equalize the TE and TM gains in an SOA has been described in J. Y. Emery et al., ECOC, vol. 3, PP 165-168 1996 and Patent document U.S. Pat. No. 6,487,007B1. Both documents used an active region comprising a single material layer. Such an active region comprising a single thick layer of material is termed a 'bulk' active. These documents used tensile strain in the bulk active region to achieve low PDG. Devices using 'bulk' actives generally have low efficiency, high optical losses and require a high injection current.

In contrast to bulk active layers, devices may comprise active regions with one or more layers (with typical thicknesses in the order of <15 nm) that act as quantum wells (QW) that confine electrons and holes to that layer when surrounded by layers of other materials. QW based devices have been found to offer enhanced performance compared to bulk active layers. The improvements that arise by using quantum wells are generally recognized as higher material gain, higher efficiency, lower loss, and lower injection current.

Typically, quantum well-based devices comprise a first layer of material bounded either side by different materials wherein the difference in conduction and valence band edge levels between the first and bounding different materials create a quantum well for any of the electrons or holes in the gain medium. Devices typically comprise one or more (multi) quantum wells (MQW) formed by alternating layers of different materials. The layers in between the layers acting as quantum wells are typically called barrier layers. Typically an MQW structure comprises alternating layers of a first material bordering a second material such that a barrier material layer is disposed between and borders two quantum wells. Barrier material may also be present at the ends of a MQW stack.

The larger the energy difference between the band edge energy levels of the well and the surrounding barrier layers, the stronger the confinement of the holes or electrons. One measure of this confinement strength is termed the 'offset split ratio' which is the ratio of energy difference between well/barrier conduction band edges for the electrons to the energy difference between well/barrier valence band edges for the holes.

As shown in FIGS. 3 and 4, the energy levels that light or heavy holes can take in a quantum well are discrete quantized values below the band edge energy level for the particular hole whereas the energy levels of the electrons in a well take discrete quantized values above the band edge energy level for the electrons. To the first order of approximation, g(TE) is primarily generated from the electron-heavy hole transition, while g(TM) is mainly from the electron-light hole transition. For purposes of this application, the heavy hole, light hole and electron wavefunctions shall be termed as the HH-wavefunction, LH-wavefunction and E-wavefunction respectively. The contribution from the E/HH or E/LH transitions to the material gain is determined by the overlap of the E/HH wavefunctions and E/LH wavefunctions respectively. The greater the wavefunction overlap, the greater the contribution to gain for that transition. The Terms 'heavy' and 'light' holes are known to those skilled in the art and are described in publications such as "Physics of Optoelectronic Devices", by Shun Lien Chuang, 1995 Wiley, New York). A heavy hole has a larger effective mass than a light hole and is expressed in terms of different set of angular momentum states as a result of different respective positions of the light and heavy holes in a Brillouin zone. Strictly speaking however, the heavy hole and light hole states are mixed states, especially away from the zone center in wave vector, k-space, as such the gain coefficients arising from transitions with from a light hole and a heavy hole are typically numerically calculated.

Previously, the band structure of prior art QW and bulk devices have focused on direct band gap transitions (otherwise known as type-I). Direct band gap transitions occur when no change in momentum is required for a transition between the minimum quantized electron energy level in the conduction band and the maximum quantized hole energy level in the valence band. The term 'minimum quantized electron energy level' refers to the quantized electron energy level nearest to the conduction band edge (or first electron level) and 'maximum quantized hole energy level' refers to the quantized hole energy level nearest the valence band edge (or first hole level). In an MQW gain medium this has the effect that the minimum quantized electron energy level in the conduction band and the maximum quantized hole energy level in the valence band are spatially located in the same material. FIG. 3 shows an example of the band structure (hole band 23 and electron band 21) of a device where the direct band gap transition occurs in a well 25 between a first heavy/light hole level 24 and a first electron level 22. The well is bordered by a barrier layer 26.

An alternative MQW bandstructure is the indirect (type-II) bandstructure which requires a change in momentum for a transition between the minimum quantized electron energy level in the conduction band and the maximum quantized hole energy level in the valence band. In a MQW gain medium, as shown in FIG. 4 the type II bandstructure (electron band 27 and hole band 29) has the minimum (first electron level) quantized electron energy level 28 in the conduction band in one material (e.g. well layer 31) whilst the maximum quantized hole energy level (first hole level) 30 in the valence band is in the another material (e.g. barrier layer 32).

In comparison with Type-I (direct bandgap) MQW structures, type-II MQWs are commonly thought to provide an unfavorable gain medium for lasers or SOAs, because of low wavefunction overlap between electrons and holes. FIG. 5 diagrammatically shows the first electron wavefunction 38 and first hole wavefunction 36 for a type-II MQW band structure (electron band 33 and hole band 35) with a thick barrier 40. The low wavefunction overlap is due to the electron wavefunction 38 (hence first electron level 34) being confined to individual wells 39, whilst the LH and HH wavefunctions 36 (hence first hole energy level 37) are confined in the barriers 40. J. B. Khurgin et al., IEEE Photonics Technol. Lett., vol. 14, pp. 278-280, 2002 theoretically proposed using a Sb-based strain free Type-II MQW SOA to reduce crosstalk, as a result of longer carrier life time. However, no attempt was made to demonstrate that such a structure can achieve a useful gain level, and also no indication was given on how the design might be used to obtain the low PDG required for most SOA applications.

R. Q. Yang, et al., IEEE J. Quantum Electronics, vol. 38, pp. 559-568, 2002 showed that at longer mid infrared wavelength bands from 3 µm to 5 µm it is possible to use interband tunnelling in InAs—InGaSb based type-II MQWs to realize a semiconductor laser. The MQW design however, for a semiconductor laser does not need to provide a low PDG, and the effect of such a design on low PDG was not disclosed.

The unsuitability of indirect bandgap band structures has led to prior art devices typically using a type-I based band structure, whereby both the heavy and light hole transitions are direct bandgap. MQW gain structures can be grown such that the structure is strained with respect to the substrate the device is grown upon. In principle, any semiconductor layer can be grown upon another semiconductor layer, however in order for the crystal structure to continue through the layers, the lattice constants must sufficiently match. This is difficult to do in practice with semiconductor layers with entirely different constituent elements, therefore it is typical in practice for devices to be grown as a material 'system' whereby the majority of the constituent elements in the QW, barrier and other material layers are the same but are formed with different mole fractions.

When different semiconductor layers are grown upon each other, the different material compositions can give rise to a mismatch in lattice constant between the deposited layer and the underlying thick substrate that the gain medium is grown upon. When the lattice constants between the deposited layer and the substrate layer are not matched, the deposited layer becomes either tensile or compressive strained. For an unstrained layer the valence band edges for the light and heavy holes are degenerate, however when strain is applied to the layer the valence band edges for the light and heavy holes split and move away from each other. As the valence band edges for the light and heavy holes change, the corresponding confinement of the respective holes changes. It is thus possible under certain circumstances for the E-HH transition to be type II and E-LH transition to be type I.

Different amounts of strain are introduced by varying the composition of the deposition layer. Introducing strain has the effect of breaking the degeneracy of the LH and HH valence band edge energy levels. Changing the amount and type of strain (tensile or compressive) by changing the layer composition changes the quantized energy levels of the light and heavy holes and the confinement of the LH and HH resulting in a change in the wavefunction overlap. Thus, introducing strain in the QW structure allows the relative gain levels for the TE and TM polarization states to be altered. However introducing increasing amounts of strain increasingly introduces unwanted defects in the layer, changes the bandgap and also the central wavelength peak of operation for the light-hole and heavy-hole transitions.

A number of methods using strained MQWs to realize low PDG SOAs have been reported. One approach using MQW as the gain medium in which barriers are tensile strained and wells are strain free was reported by K. Magari et al. IEEE Photonics Technol. Lett, vol. 2, pp. 556-558, 1990. K. Magari et al. used a gain medium comprising 10.5 nm thick unstrained quantum well layers and 11.5 nm thick barrier layers with −1.7% (tensile) strain. The SOA was 660 μm long and provided 1.0 dB of PDG and 13.0 dB of fiber to fiber gain with an injection current of 200 mA.

An alternative approach reported by M. A. Newkirk et al. IEEE Photonics Technol. Lett., Vol. 4, pp. 406-408, 1993. Newkirk used a gain medium comprising three 3.5 nm thick compressive wells with 1.0% (compressive) strain, three 16 nm thick tensile strained wells with −1.0% (tensile) strain, and seven 10 nm thick, strain free barriers. The SOA was 625 μm long and provided less than 1.0 dB PDG and 4.4 dB fiber to fiber gain with an injection current of 150 mA.

Another approach reported by D. Sigogne et al. ECOC, pp. 267-270, 1995, Electron. Lett., vol. 32, pp. 1403-1405, 1996 used sixteen 8 nm thick 1.1% (compressive) strained wells and sixteen 7 nm thick −0.9% (tensile) strained barriers as the gain medium. The SOA was 940 um long and provided less than 1.0 dB PDG and 23.0 dB fiber to fiber gain with a 150 mA injection current.

The materials used for the wells and barriers in the above prior art documents using Type-I bandstructures were generally based on compositions of InGaAs or InGaAsP grown on an InP substrate, and for operation at a wavelength of 1.55 um.

Devices operating at the 1310 nm wavelength range comprising gain mediums using compositions of $In_{1-x-y}Al_xGa_yAs$ grown on an InP substrate have been described in the prior art. One prior art document describing a laser operating in the 1310 nm wavelength range is described by M. Yamada et al., IEEE, Photonics Technol. Lett., vol. 11, p 164-167, 1999. The bandgap of a gain medium comprising $In_{1-x-y}Al_xGa_yAs$ is very dependent upon the Al mole fraction. It is practically difficult to epitaxially grow gain mediums with bandgaps requiring low Al mole fractions. Therefore, prior art using $In_{1-x-y}Al_xGa_yAs$ quantum wells have concentrated on optical wavelengths close to the 1310 nm band because in this wavelength range, the Al content of the material can be kept above −15% for unstrained layers, thus making the growth easily controllable. Another example of a laser operating at a wavelength range centered around 1310 nm is described by C. Zah et al., IEEE J. Quantum Electronics, vol. 30. p 511-522, 1994. Lasers, however, are designed to be singularly polarized either in the TE or TM mode and as such are designed to have high gain in one polarization and low gain in the orthogonal polarization.

A 1310 nm wavelength low PDG SOA was described by P. Koonath, et al., IEEE Photonics Technol. Lett., vol. 13, pp. 779-781, 2001. In Koonath, the low PDG was realized by introducing 0.33% tensile strain into 3 quantum well layers whilst the barrier layers were strain free.

To make devices operating at longer wavelengths such as the commonly used 1550 nm range (C-band), the amount of Al in the $In_{1-x-y}Al_xGa_yAs$ MQW needs to be greatly reduced such that values for mole fraction 'x' are typically around 5%. Under these conditions it is very difficult to grow the InGaAlAs with sufficient control in the Al mole fraction to enable the level of control needed to repeatably obtain a low PDG device using the standard type-I band structure, since the material bandgap becomes very sensitive to the Al mole fraction.

Despite the improved temperature performance of the $In_{1-x-y}Al_xGa_yAs$ lasers and SOAs of the prior art operating in the 1310 nm range, repeatedly manufacturing a low PDG SOA is still problematic because introducing strain to change the heavy and light hole confinement also changes the bandgap of the quantum well. Furthermore, at longer wavelength ranges such as around 1550 nm, the Al mole fraction becomes difficult to manufacturably control.

SUMMARY OF THE INVENTION

Embodiment, of present invention provide an optical amplifier for accepting input light and outputting amplified light, the optical amplifier comprising: an optical waveguide for accepting input light and outputting amplified light; a gain medium comprising a plurality of adjoining semiconductor layers to provide optical gain: electrodes to pump electric current through the gain medium; wherein adjoining semiconductor layers define one or more quantum wells for electrons and are operative to provide both direct and indirect electron-hole transitions in the gain medium whereby; a first quantized electron energy level in the conduction band is located in a first layer; a first quantized hole energy level in the valence band is located in said first layer; a further first quantized hole energy level in the valence band is located in an adjacent second layer; the second layer has a different material composition to the first layer; wherein the first quantized hole energy level in the first layer is either a light hole state or a heavy hole state and the further first quantized hole energy level in the second layer is a different hole state to the first quantized hole energy level in the first layer.

Such an optical amplifier could also be used as a superluminescent diode (SLD) whereby the ASE light generated and output from the device is used as a light source.

The optical amplifier may be configured such that the gain medium has a first modal confinement factor (MCI) for a first optical polarization and a second modal confinement factor (MC2) for a second optical polarization; wherein: the product of MCI and the gain from transitions between the first quantized electron energy level in the conduction band and the first quantized hole energy level in the valence band in the first layer; is matched to within 20% of; the product of MC2 and the gain from transitions between the first quantized electron energy level in the conduction band and the further first quantized hole energy level in the valence band of the second layer.

The second layer may comprise $In_{1-x-y}Al_xGa_yAs$.

In a further aspect, the present invention also provides a device comprising a gain medium; the gain medium comprising a plurality of adjoining semiconductor layers to provide optical gain: wherein adjoining semiconductor layers define one or more quantum wells for electrons and are operative to provide both direct and indirect electron-hole transitions in the gain medium whereby: a first quantized electron energy level in the conduction band is located in a first layer; a first quantized hole energy level in the valence band is located in said first layer; a further first quantized hole energy level in the valence band is located in an adjacent second layer; the second layer has a different material composition to the first layer; wherein the first quantized hole energy level in the first layer is either a light hole state or a heavy hole state and the further first quantized hole energy level in the second layer is a different hole state to the first quantized hole energy level in the first layer; and wherein the second layer comprises $In_{1-x-y}Al_xGa_yAs$ (x>0, y>0).

DETAILED DESCRIPTION OF ILLUSTRATIVE EMBODIMENTS

The present invention addresses the problem of controlling the amount of TE and TM gain (or loss) in a device by control of the thickness and/or number of layers in a semiconductor gain medium (also known as an 'active region/medium' or optical gain structure). The width of the gain medium is preferably between and including 1 μm to 5 μm. Preferably the gain medium width is between and including 1 μm to 2 μm. The gain medium thickness is preferably between and including 0.1 μm to 0.2 μm, however other gain medium cross sectional geometries can also be used.

Figure 1:
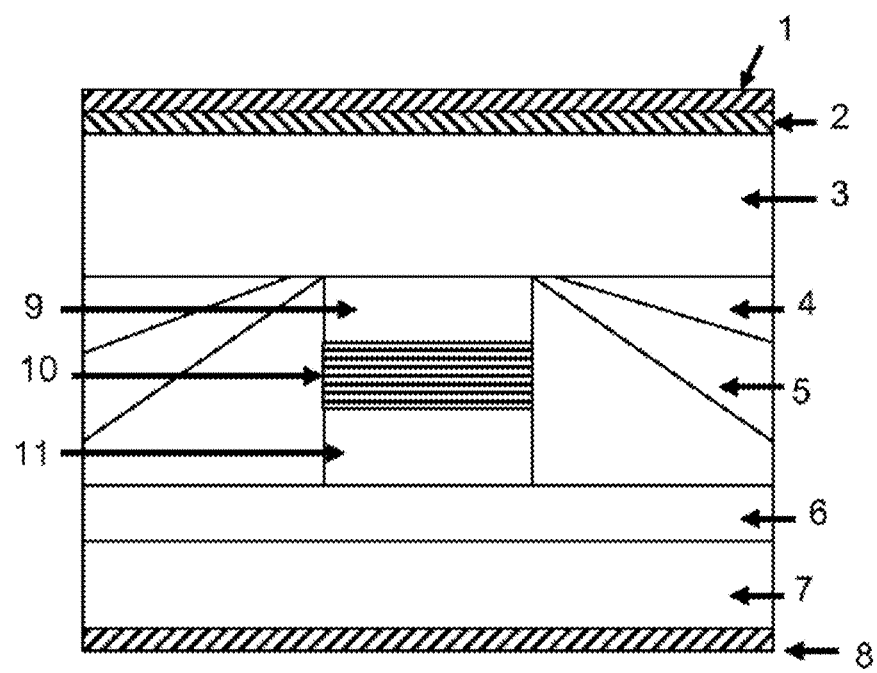
FIG. 1 shows a cross section of a buried heterostructure waveguide device.

The device of the present invention may comprise a buried heterostructure waveguide structure as shown in FIG. 1 comprising: a vertical mesa comprising a p-type capping layer (typically comprising InP) 9 covering a gain medium 10 and an n-type layer (typically comprising InP) 11; an n-type cladding layer 6 and an n-type substrate (typically comprising InP) 7 beneath the mesa; one or more n-type blocking layers (typically comprising InP) 4 and p-type blocking layers (typically comprising InP) 5 disposed either side of the mesa; a p-type layer (typically comprising InP) 3 covering the mesa and blocking layer/s; a contact layer 2 immediately above the layer 3; an upper electrode 1 deposited upon the contact layer 2 and a lower electrode 8 deposited beneath the substrate 7.

Figure 2:
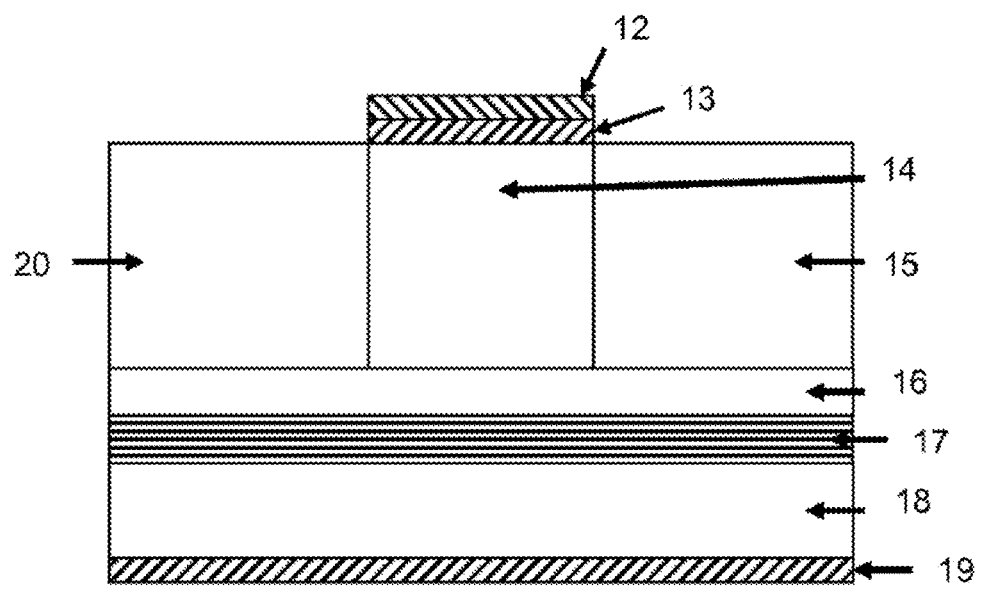
FIG. 2 shows a cross section of a ridge waveguide device.
Figure 3:
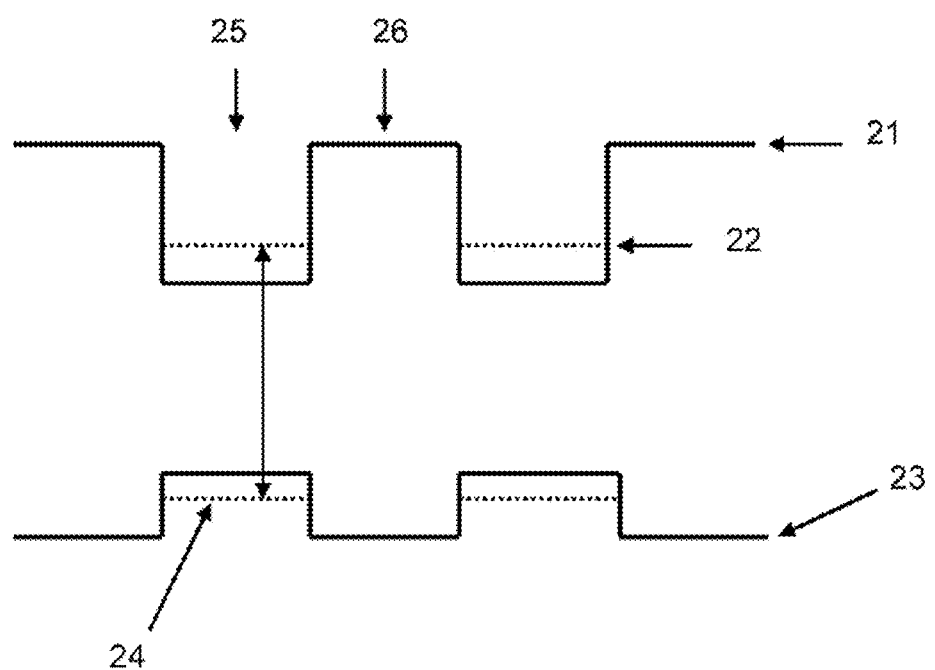
FIG. 3 shows a type-I multi-quantum well band structure.
Figure 4:
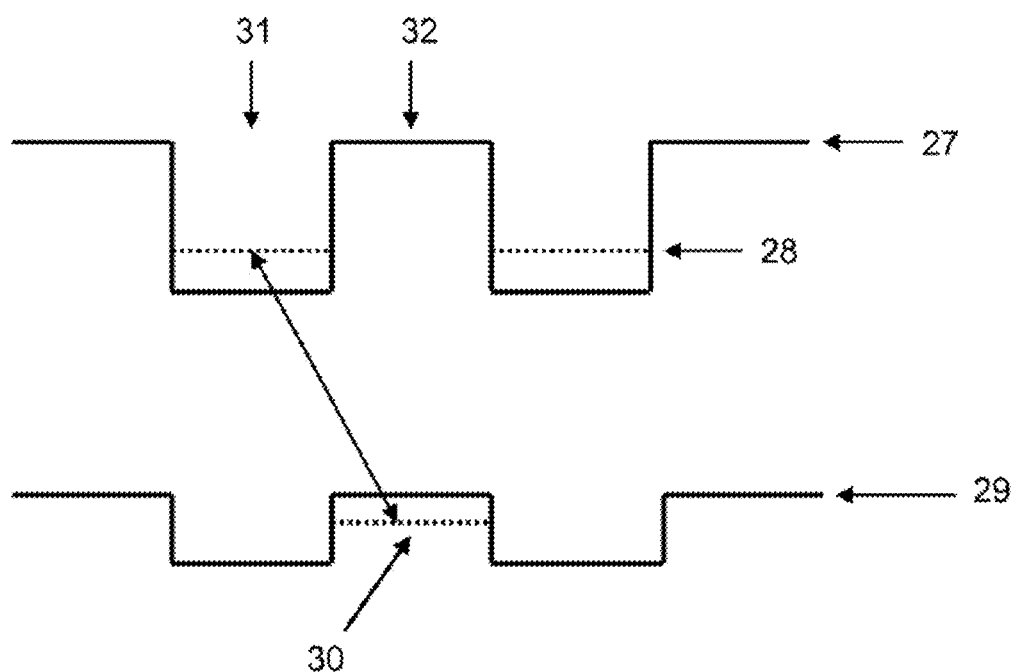
FIG. 4 shows a type-II multi-quantum well band structure.

Alternatively, the device may comprise a ridge waveguide structure as shown in FIG. 2 comprising: an n-type substrate (typically comprising InP) 18; a gain medium 17 located on the substrate 18; a p-type cladding layer 16 immediately above the gain medium 17; a p-type layer 14 above the cladding layer 16 patterned and etched to form a vertical mesa surrounded each side by silicon nitride layers 15, 20; a contact layer 13 above the p-type layer 14; an upper electrode 12 covering the contact layer 13 and a lower electrode 19 beneath the substrate 18.

The above two structures are only preferred examples of how device of the present invention may be formed. Other suitable structures may also be used.

An example of the present invention provides an optical amplifier comprising an optical waveguide to accept input light and output amplified light, a gain medium comprising a plurality of adjoining semiconductor layers to provide optical gain and electrodes 1 to pump electric current through the gain medium. The adjoining semiconductor layers define one or more quantum wells for electrons. A first quantized electron energy level in the conduction band and a first quantized hole energy level in the valence band are located in a first layer (first semiconductor material layer). A further first quantized hole energy level in the valence band is located in an adjacent second layer (second semiconductor material layer). The second layer has a different material composition to the first layer.

The gain medium may be a part of/integral with the waveguide or separate from the waveguide. The first quantized hole energy level in the first layer and the further first quantized hole energy level in the second layer each refer to one of either the maximum heavy hole energy levels or the maximum light hole energy levels (otherwise referred to as the first heavy hole level and first light hole level). In reality the minimum energy level (or ground state) for electrons in quantum wells is the level closest to the band edge, and the energy level closest to the valence band for holes in quantum wells is also the minimum energy level for holes (or ground state). In this document, however, to make the text easier to understand with respect to the diagrams, we have used electron minimum energy level to refer to the lowest energy state or ground state for electrons in quantum wells and hole maximum energy level to refer to the hole state nearest to the valence band edge or ground state; i.e increasing energy is always upwards in the diagrams (for both electrons and holes).

The device may in principle be any optical amplifier comprising a medium suitable for providing optical gain comprising two or more different types of semiconductor materials. Preferably the device is a Semiconductor Optical Amplifier. Preferably the SOA comprises at least one, preferably two anti-reflection coated facets at the ends of the length of the device where the waveguides output light. The end facets may be angled in the plane of the device, preferably between 7 and 10° so that any optical reflections from the end facet do not propagate back down the waveguide (the angled waveguide is not a necessary feature, but it helps to lower the residual reflection). The term material 'layer' for purposes of this application layer relates to any cross sectional geometry but preferably is a rectangular based cross section with one major dimension larger than the other major dimension. Typically, the device is grown on a substrate wafer whereby the width of the 'layers' are parallel to the plane of the wafer; the width being larger than the thickness. The device may in principle be formed using any known semiconductor fabrication methods, preferably Metal Organic Vapour Phase Epitaxy (MOVPE).

The first and second layers forming a MQW stack are quantum mechanically coupled and preferably contact and border each other, however in principle one or more other different layers may be interposed between them. The gain medium may comprise further material layers other than the first and second layers. Preferably the invention comprises two or more first layers and/or two or more second layers. Preferably the first and second layers form an MQW stack whereby two or more of one layer type alternately sandwich one or more of the other layer type. The first and second layers may be any thickness, but preferably comprise a thickness between 2 nm to 15 nm. The gain medium is typically bordered on the top and bottom by one or more separate confinement heterostructure (SCH) layers that enable a p-n junction to be formed across the gain medium.

The spatial separation of the first and further first quantized hole energy levels in the corresponding first and second layers is typically accomplished by introducing strain into one or more of the layers and properly choosing the bandgaps. By applying a suitable amount of strain to the layer acting as an electron quantum well, the heavy and light hole valence band edge energy levels are moved apart so that the valence band edge energy of one hole type in the first material layer is greater than valence band edge energy of the same hole type in the second material layer whilst the valence band edge energy of the other hole type in the first material layer is less than valence band edge energy of the same hole type in the second material layer. Because the maximum valence band edge energies for each hole exist in different layers, the first layer becomes a quantum well for one type of hole whilst the second layer becomes a quantum well for the other type of hole.

Therefore, in contrast to the devices of the prior art which either had type I transitions for both heavy and light holes or type II transitions for both heavy and light holes, the present invention provides an optical amplifier with a gain medium providing both direct and indirect transitions. When heavy and light holes are either both type I or type II transitions, the strain required to change the relative HH and LH wavefunction confinement may: a) undesirably alter the peak wavelength of each transition away from the optimum operating value of the device; and/or b) be excessively high so that material defects occur in the fabrication of the device degrading its performance. Large amounts of strain in a material layer makes the layer become unstable when grown and relax to form a large number of dislocations that would cause the formation of excessive non-radiative recombination centers. Such non-radiative recombination centers would make the material unsuitable for the generation of sufficient spontaneous emission to realize a device such as an SOA or semiconductor laser.

By having one electron-hole transition as a type I (direct bandgap) transition and the other electron-hole transition as a type II (indirect bandgap) transition in the gain medium, the wavefunction peaks for the light and heavy holes in the gain medium become spatially offset across the layer thicknesses (perpendicular to the plane of the wafer layer). The relative amount of E-HH transitions to E-LH transitions, (hence relative amounts of TE and TM gain) can be varied by changing the ratio of the thickness of each of the first and second layers. The relative amount of electron transitions can also be changed by varying the number of first layers to second layers.

Because the LH and HH wavefunction peaks are spatially offset from each other based upon the minimum valence band edges being spatially separated, changes in the relative thicknesses of the first and second layers changes the relative confinements of the HH and LH wavefunctions. In turn, the HH-E-wavefunction overlap (providing TE gain) changes in a different manner to the LH-E-wavefunction (providing TM gain). The present invention therefore provides an additional means to control the relative overlap of the HH and LH wavefunctions with the E-wavefunction thus providing a mechanism to balance the TE and TM gain without necessarily needing to require undesirable or unfavourable values of strain in the layers. The extra degree of TE/TM gain control gives the manufacturer of the device more freedom to choose the correct bandgap with low values of strain.

Following on from and referring to the previous example of the invention the inventors of the present invention have further found that if the conduction band edge energy level in the first material layer is lower than the conduction band edge energy level in the second material layer, and the first material layer comprises tensile strain, the light holes may be quantum confined to the first material layer whilst the heavy holes are quantum confined to the second material layer so that the E/HH transition is indirect and the E/LH transition is direct.

In this arrangement, the first material layer becomes a quantum well for the electrons and the light holes and the second material layer becomes a barrier for the electrons and the light holes; whereas the second material layer becomes a quantum well for the heavy holes and the first material layer becomes a barrier for the heavy holes. In this arrangement, one or more layers of first material preferably alternately sandwich and border one or more layers of second material. One or more additional layers of second material may border the outside of the outermost layers of first material such that 'n' first layers may be bounded by n+1 second layers, n second layers or n−1 second layers.

Figure 6:
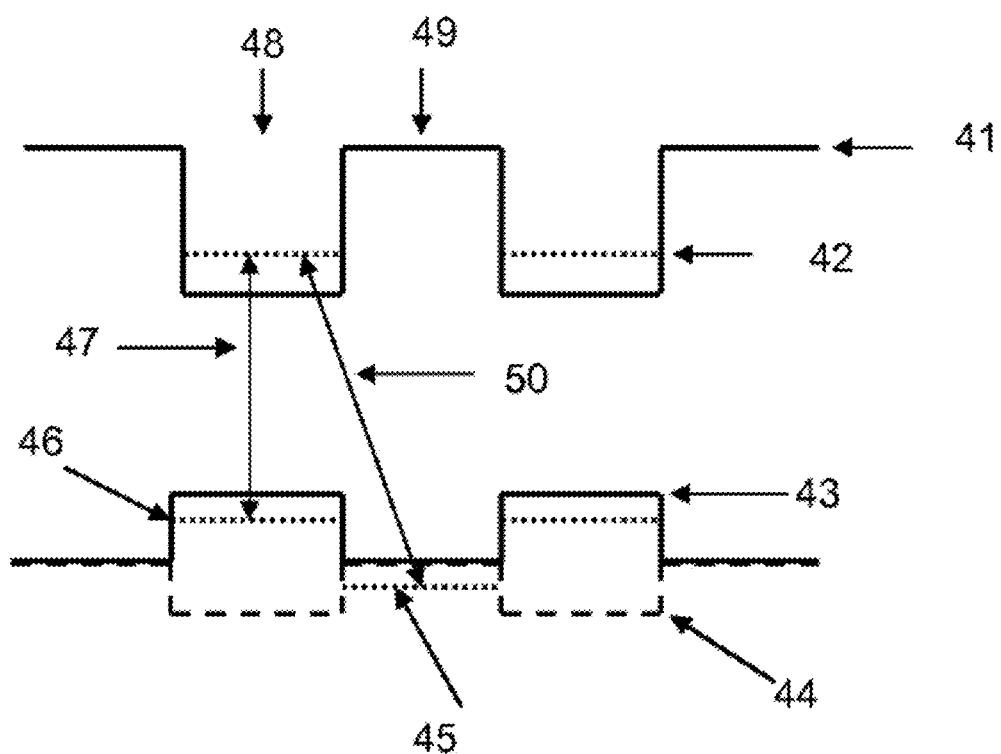
FIG. 6 shows a mixed type-I, type II band structure of the present invention.

As an example, a schematic diagram of the band structure of a device according to the present invention is shown in FIG. 6. In this diagram there are two layers of first material confining the electrons (electron band edge 41 and first electron level 42) and the light holes (light hole band edge 43 and first light hole level 46), and only one layer of second material confining the heavy holes (heavy hole band edge 44 and first heavy hole level 45). In this diagrammatical structure there are 2 light hole 'wells' contributing to the TM gain, and only one heavy hole 'well' contributing to the TE gain. However, by introducing another two second layers in the structure, there will be n+1 heavy hole 'wells' to contribute to the TE material gain.

In practice, it is desirable that the gain medium only supports the lowest TE and TM modes, generally refer as TE0 and TM0. As a result, there is little scope to adjust the overall width and thickness of the gain medium. It is therefore advantageous to have as much freedom in the gain medium design as possible. Because in the present invention the number and thicknesses of each layer can be varied, the designer of the structure has a large degree of freedom in choosing the optimum layer thicknesses and number so that the material layer composition may be tuned to the correct bandgap and with the minimum amount of strain to cause the heavy holes to become indirect transitions and the light holes to be direct transition.

Figure 5:
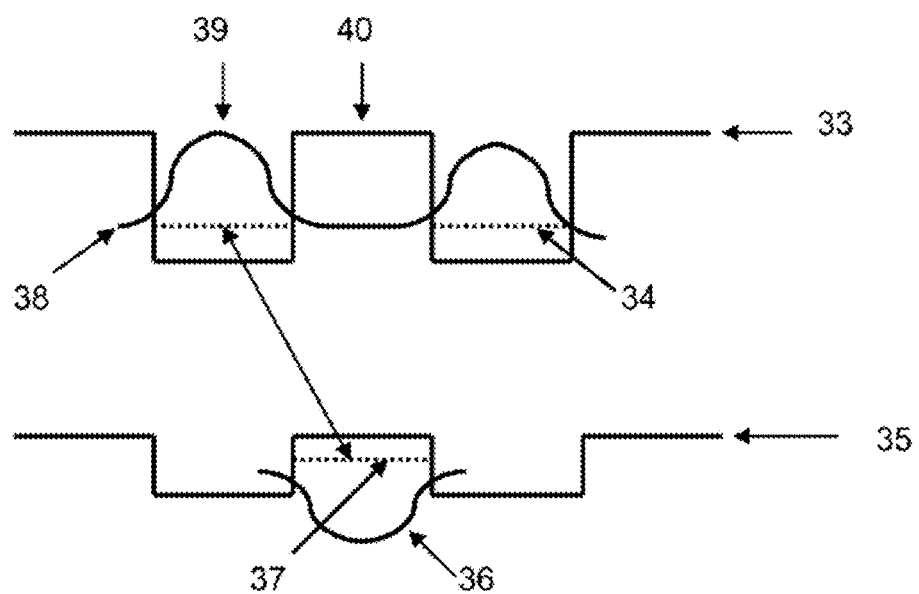
FIG. 5 shows a type-II MQW band structure with a thick barrier.
Figure 7:
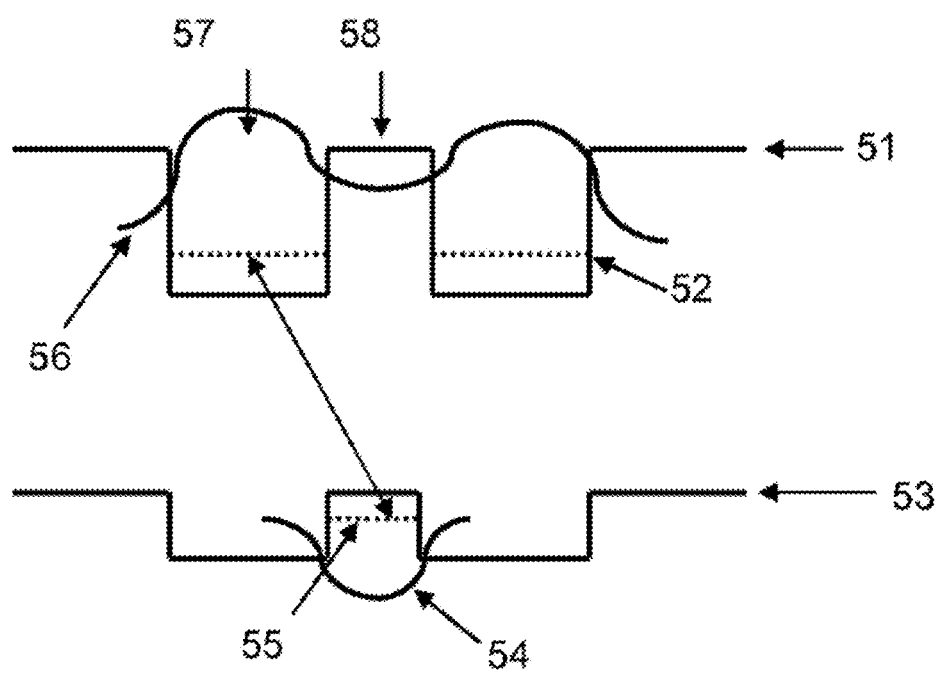
FIG. 7 shows the band structure of a device of the present invention with a reduced barrier thickness.

If the HH-wavefunction is mainly located in the one or more second layers, the E-HH wavefunction overlap is small because the E-wavefunction 38 has limited presence in the second layer (see FIG. 5). To increase the small E-HH wavefunction overlap, stronger quantum coupling between the layers may be required. This may be achieved by reducing the thickness of one or more of the second layers, typically to thicknesses <10 nm. FIG. 7 schematically shows the band structure (electron band 51, heavy hole band 53) where a thinner second layer (barriers 58 having a first heavy hole energy level 55) has as an effect upon on the electron wavefunction 56 and first heavy hole wavefunction 54 in the gain medium. The first layers (wells 57), with a first (minimum) electron energy level 52, become strongly quantum mechanically coupled so that the E-wavefunction 56 penetrates into the second layer (barriers 58) to a greater extent. As a result, the E wavefunction 56 overlaps to a greater extent with the HH-wavefunction 54 increasing the TE gain.

Following on from and referring to any of the previous examples of the invention, the inventors of the present invention have further found that when the first material layer is tensile strained and acts as a quantum well for the electrons and light holes, and the second material layer comprises $In_{1-x-y}Al_xGa_yAs$ (x>0, y>0) then the band offset split ratio between the first and second layer is approximately 70/30. This split ratio entails that nominally the electrons are confined to a greater extent than the holes. The second material layer may be strain free (0% strain), under tensile strain or compressive strain. Preferably tensile strain in one or more of the first material layer/s is between 0.5% to 2.0%. Preferably the strain in one or more of the second material layer/s is between 0.3% tensile strain to 0.3% compressive strain. Preferably the second material layer comprises $In_{1-x-y}Al_xGa_yAs$ ($0<x<=0.48$, $0<y<0.6$). Preferably the second material layer comprises $In_{1-x-y}Al_xGa_yAs$ ($0<x<=0.4$) ($0<y<0.6$).

Electrons are not as well confined in quantum wells compared to holes due to the electrons smaller effective mass. The greater the confinement of electrons, with large potential barriers each side of the quantum well, the better the overlap of the electron and hole wavefunctions which leads to improved radiative (light emitting) recombination efficiency, particularly when the device is operating at high temperatures. It is therefore desirable to have an offset split ratio in favor of the conduction band (for example a split ratio of 70/30 would confine electrons to a greater extent than an offset split ratio of 60/40). Preferably, both the first and second layer/s comprise $In_{1-x-y}Al_xGa_yAs$ so that the gain structure comprises an $In_{1-x-y}Al_xGa_yAs$ 'system', however in principle any other material for the first layer may be used providing it can be successfully grown with the second layer and provide the desired bandgap and offset split ratio. The first material layer may comprise $In_{1-x-y}Al_xGa_yAs$ (where $x=>0$, $y>0$). Preferably the first material layer comprises $In_{1-x-y}Al_xGa_yAs$ ($0<=x<=0.48$, $0<y<0.6$). Preferably the first material layer comprises $In_{1-x-y}Al_xGa_yAs$ ($0<=x<=0.4$) ($0<y<0.6$). Typically the substrate for an $In_{1-x-y}Al_xGa_yAs$ 'system' would be InP.

If the second layer comprises $In_{1-x-y}Al_xGa_yAs$ ($x>0$, $y>0$) then the device may not be restricted to an optical amplifier but can in principle be any device comprising an optical gain medium.

Devices of the present invention using an $In_{1-x-y}Al_xGa_yAs$ 'system' therefore provide higher efficiency and temperature independence than equivalent devices using an $In_{1-x}Ga_xAs_yP_{1-y}$ system which have a −40/60 offset split ratio.

Devices of the present invention using an $In_{1-x-y}Al_xGa_yAs$ 'system' also provide greater flexibility and allow for lower layer strain than $In_{1-x}Ga_xAs$ systems, where both first and second materials comprise different compositions of $In_{1-x}Ga_xAs$. The strain and bandgap in $In_{1-x}Ga_xAs$ systems are directly linked because a change in the Gallium (Ga) content automatically changes the Indium (In) content and strain. Therefore the strain in a layer in an $In_{1-x}Ga_xAs$ system is dictated by the required bandgap for that layer. Devices of the present invention using an $In_{1-x-y}Al_xGa_yAs$ 'system' however may have layers with various values of layer strain for a chosen layer bandgap because both the Al and Ga content may be changed to give the desired bandgap and layer strain, i.e. there is an extra degree of freedom.

Devices of the present invention using an $In_{1-x-y}Al_xGa_yAs$ 'system' therefore provide the desirable combination of advantages of higher electron confinement and decoupling of strain and bandgap so that a high efficiency device may be manufactured with low values of strain in the first layer/s. Furthermore, because the of the approximate 70/30 split ratio, the energy level difference (hence confinement) between the nominally unstrained valence band edges of the first and second layers is small compared to systems such as the $In_{1-x-y}Ga_xAs_yP$ system with offset ratios that give greater confinement to holes. The smaller energy difference between the valence band edges of the first and second layer therefore requires less tensile strain to cause the heavy hole valence band edge energy in the first layer to drop below the heavy hole valence band edge energy in the second layer and so provide type II behaviour for the E-HH transition.

PREFERRED EXAMPLE

Devices were fabricated with a gain structure comprising of five 'wells' 48 and six 'barriers' 49. The 'wells' 48 were each grown to be 11 nm thick whilst the 'barriers' were grown to be 7 nm thick, wherein between each 'well' was grown a single 'barrier'. Immediately above and beneath the gain medium were SCH layers.

The device in this example is an SOA (Semiconductor Optical Amplifier) but could in principle be any device with a semiconductor gain/loss medium. The SOA gain medium comprises an $In_{1-x-y}Al_xGa_yAs$ MQW stack comprising alternate first layers 48 ('wells') of $In_{1-x-y}Al_xGa_yAs$, and second layers 49 ('barriers') of $In_{1-x-y}Al_xGa_yAs$. The wells have a smaller bandgap energy than the barriers 49. The compositions of the well material are chosen for the well 48 and barrier 49 to give: a bandgap for a wavelength peak around 1550 nm; tensile strain in the well layers 48 and a strain free barrier 49. The tensile strain in the wells 48 causes the degeneracy of the well valence band edge energies of the light and heavy holes to break so that the heavy hole band edge is effectively 'pushed' downwards and away from electron band, and the light hole bad edge is effectively pulled towards the electron band. The heavy hole band and light hole band for the barrier is degenerate, because the barrier is grown to be approximately strain free. The electron-light hole transition 47, becomes a direct bandgap (type-I) transition; whereas the electron-heavy hole transition 50 is an indirect bandgap (type-II) transition.

Table 1 provides details of the layer compositions, strains and thicknesses of the device.

TABLE 1

| Layer | Composition | Thickness, nm | | No. of layer repeats |
|---|---|---|---|---|
| Top SCH | $In_{1-x}Ga_xAs_yP_{1-y}$ ($x = 0.27$ and $y = 0.58$) | 25 | Approximately zero strain | |
| 'Well' (first material) | $In_{1-x-y}Al_xGa_yAs$ ($x = 0.0$ and $y = 0.53$) | 11 | −0.44% tensile strained | 5 |
| 'Barrier' (second material) | $In_{1-x-y}Al_xGa_yAs$ ($x = 0.05$ and $y = 0.42$) | 7 | −0.045% tensile strained | 6 |
| Lower SCH | $In_{1-x}Ga_xAs_yP_{1-y}$ ($x = 0.27$ and $y = 0.58$) | 25 | Approximately zeo strain | |

Figure 8:
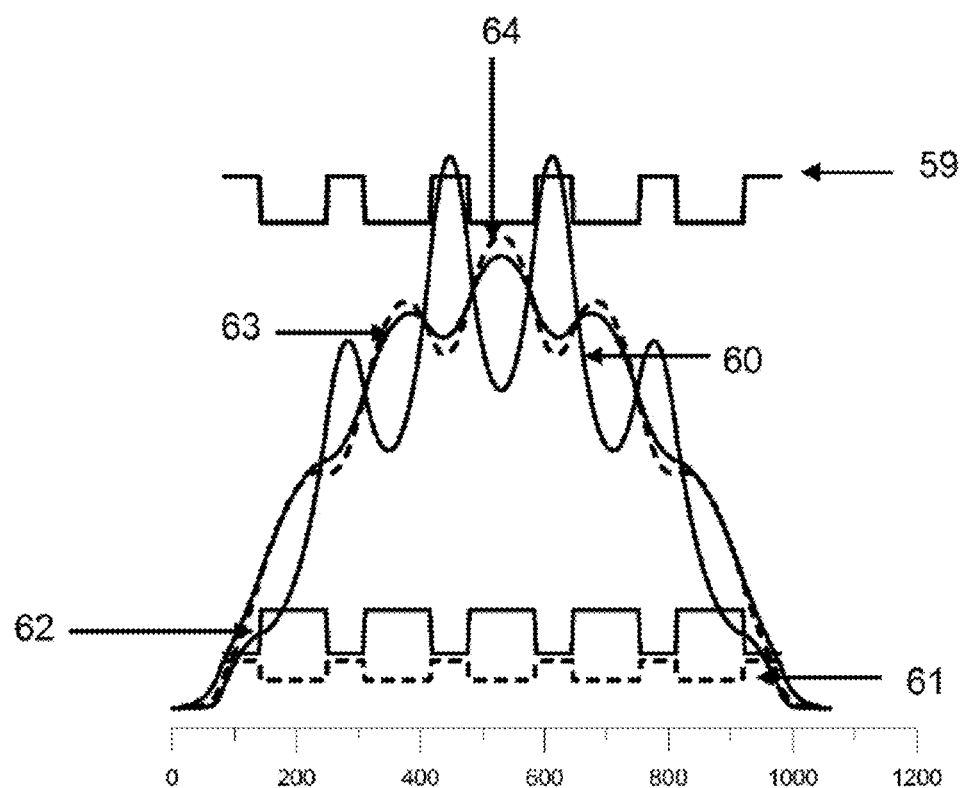
FIG. 8 shows the band structure of a preferred example of the present invention.

FIG. 8 shows a schematic of the theoretical band structure (electron band 59, heavy hole band 61, light hole band 62) and calculated wavefunctions of the device of the preferred example. For the conduction band, the first electron energy level wavefunction 64 effectively sees five quantum wells corresponding to the five layers of the first 'well' material and hence has 5 peaks. Correspondingly, the first light hole energy level wavefunction 63 also sees 5 quantum wells, hence also has 5 peaks. However, the first heavy hole energy level wavefunction 60 sees 6 quantum wells, hence comprises 6 peaks because there are six layers of the second 'barrier' material. Thus in the present device there are 5 quantum wells that contribute to the g(TM), and 6 quantum wells that contribute to the g(TE). The 'well' (first layer) and 'barrier' (second layer) thicknesses were appropriately chosen so that the quantum wells are well quantum mechanically coupled.

Multiple BH SOA devices comprising the layer structure in table 1 were fabricated using MOVPE and standard lithographic and etching techniques. The devices were formed on an InP wafer. Once fabrication was completed separate SOA devices were cleaved into bars 0.88 mm long and antireflection coated on both end facets.

Each device was rectangular in plan shape and comprised an InP substrate which was overgrown with an InP 'cladding' layer 6 doped to be n-type. A 5 µm wide InP based passive waveguide was then formed above the cladding layer. The passive waveguide was designed to mode-match to an optical fiber, preferably a lens ended fiber for high efficiency input/output coupling. Above the passive waveguide, the layers in Table 1 were then grown, patterned and etched to form a series of upstanding mesas with a width that linearly tapered from 0.3 µm at one end facet to 1.3 µm at the center of the chip. The 1.3 µm then tapered back down to a width of 0.3 µm at the opposing end facet. The tapering of the gain medium from a narrow width at the facets to a larger width in the center of the device ensures that light that enters the passive waveguide couples to the gain medium in the middle of the device for optical gain and then couples back to the passive waveguide for to provide high fiber coupling efficiency at the facet. The mesa was patterned such that the length of the mesa running from end facet to end facet was at a 10 degree angle off the perpendicular to the facet to reduce back reflections. The mesa was then covered with an overgrowth of semiconductor material to provide current blocking layers alongside walls of the mesa. The mesa was buried by growing a 5 µm layer of p-type Zn doped InP followed by a highly Zn doped InGaAs p-contact layer. The devices were then electrically bonded to allow for device assessment. The optical gain, PDG and other parameters were measured. The tapered active layer and passive waveguide is a preferred feature of the invention but in principle any suitable device design may be used, for example an active layer with uniform width along its length.

The bonded SOA devices were firstly assessed by providing drive current to the SOA and coupling the output light from the device into antireflection coated lens ended optical fibers with a mode size matched to that of the passive waveguide of the SOA. The facet to fiber coupling losses of the devices were measured to between 0.5 dB to 1.0 dB per facet. The measurement was made comparing the output power difference between using a large area detector and the amount of light in the fiber at a fixed device current and temperature.

Table 2 shows the measured values of the facet-facet gain, PDG, noise figure (NF) and Psat of one of the devices obtained by coupling laser light into the SOA at 3 wavelengths across the C-band. The Psat value is the output light level at which the SOA gain starts reducing i.e. the output saturates. The SOA device was applied with 100 mA of drive current and was maintained at an operating temperature of 20° C. respectively. The measured PDG of 0.8 dB to 1.5 dB is close to the design value of 1 dB (the gain of one polarization is within −20% of the gain in the orthogonal polarization. By reduction of the 'well' (first layer) thickness by −3 A the PDG has theoretically been shown to reduce to zero.

TABLE 2

| Wavelength, nm | Gain, dB | PDG, dB | NF, dB | Psat, dBm |
|---|---|---|---|---|
| 1535 | 12.8 | 0.8 | 6.5 | 7.3 |
| 1550 | 12.2 | 1.2 | 6.0 | 7.7 |
| 1560 | 11.5 | 1.5 | 5.8 | 8.1 |

While the preferred example shown above is for an SOA designed for moderate gain, introducing more QWs into the gain medium or by increasing the chip length will increase the gain of the SOA. Increasing the number of QWs will alter the relative TE and TM modal confinement factors, therefore to achieve low PDG in such a 'higher gain' device, it is therefore be necessary to modify either the tensile strain in the 'well', the well thickness, the barrier thickness the 'barrier' strain or any combination of the above. The device of the present invention can also be used for more complex structures such as being incorporated within integrated optic devices, reflective SOA and external cavity tunable lasers.

Figure 9:
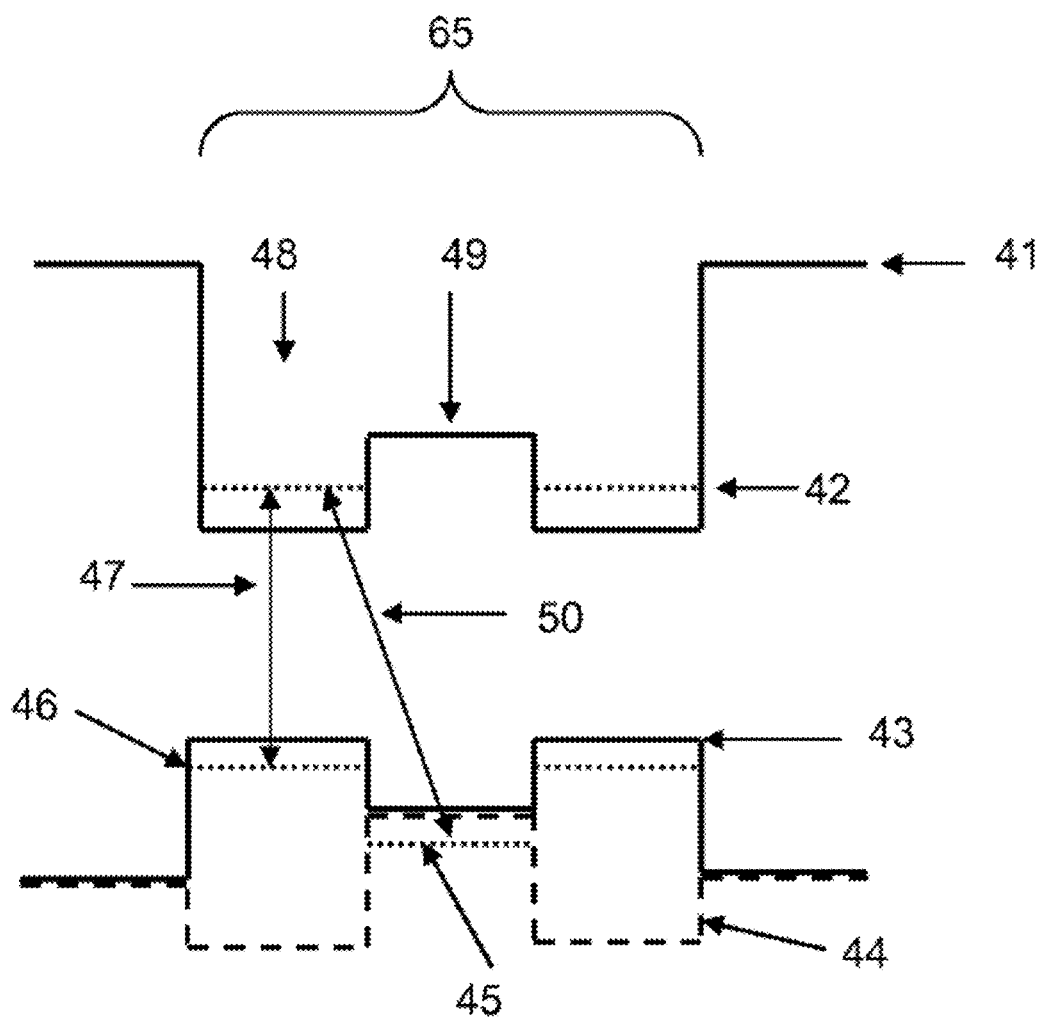
FIG. 9 shows the band structure of a composite quantum well according to another preferred example of the present invention.
Figure 10:
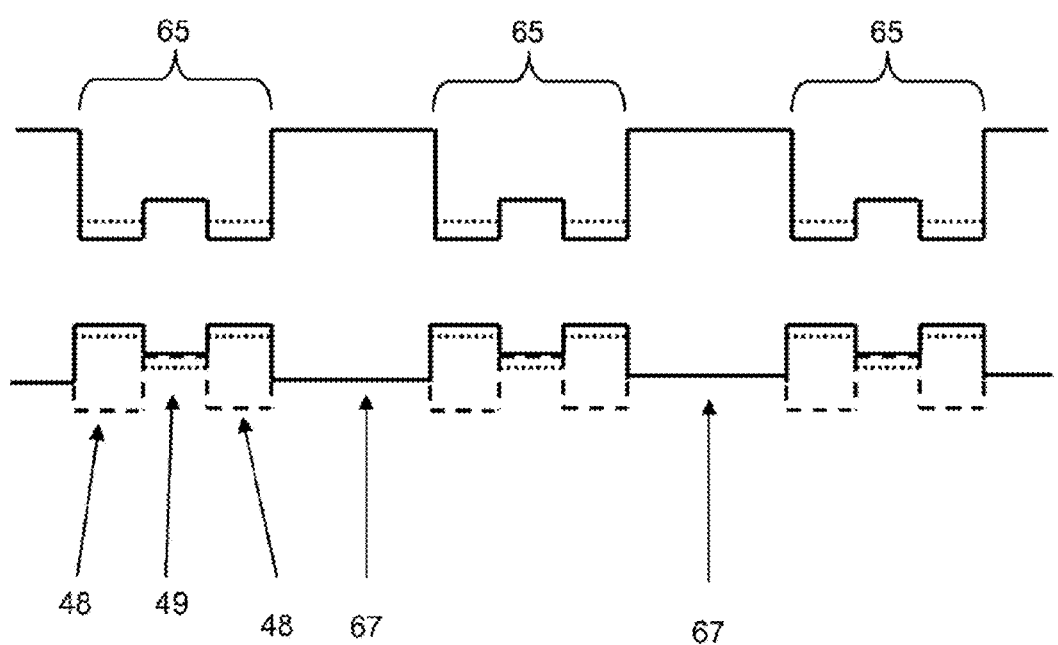
FIG. 10 shows three composite quantum wells of FIG. 9 separated by further barrier layers.

Another example of the present invention is shown in FIGS. 9 and 10. This example is similar to the preferred example shown in FIG. 6 except that the wells 48 and barriers 49 both reside in an overall 'composite' quantum well 65. This composite well 65 is an arrangement of one or more wells 48 and barriers 49 that form a unit that can replace the simple single well layer in an MQW structure. FIG. 10 shows an example of three such composite quantum wells 65 bordered and separated by two further barriers layers 67, however in principle any number of composite quantum wells 65 and further barriers 67 may be used. The energy barrier differences between the well 48 and further barrier 67 are larger than the energy differences between the well 48 and barrier 49 in the conduction and valence bands respectively.

In such a structure there needs to be at least 3 different material compositions: two material compositions for the composite well/s 65 as shown in FIG. 9 (one for the well/s 48 and one for the barrier/s 49); and one for the further barrier/s 67 between the composite quantum wells. This structure has the same advantages as the structure already described in FIG. 8, in terms of improved control over TE and TM gain through use of type I and type II quantum wells, but here there is extra freedom to design a large overlap of electron to heavy hole indirect transition. The designer of the device may vary: the material compositions; thicknesses and relative number of the wells 48 and barriers 49 in each composite well; the number of composite wells 65 compared to the number of further barriers 67; and the thickness and material composition of the further barriers 67. Preferably one or more further barrier layers 67 are alternately sandwiched by composite quantum wells 65. Preferably there are 'm' composite quantum wells 65 and 'm‡1' further barrier layers 67. Furthermore, a gain medium may comprise one or more composite quantum wells 65 and one or more standard single quantum wells separated by one or more further barrier layers 67.

The further barriers 67 preferably comprise $In_{1-x-y}Al_xGa_yAs$ (x>0, y>0). Preferably the further barriers 67 comprise $In_{1-x-y}Al_xGa_yAs$ (0<x<=0.48, 0<y<0.6). The further barriers 67 are preferably unstrained. In principle, the composite quantum wells 65 may have one or more wells 48 and one or more barriers 49. Each barrier 49 or well 48 in each composite quantum well 65 may be formed of a different material composition, however for ease of manufacturing it is desirable that all wells 48 in the composite quantum well 65 have the same material composition and all barriers 49 in the composite quantum well 65 have the same material composition.

What is claimed is:

1. An optical amplifier for accepting input light and outputting amplified light, the optical amplifier comprising:
   an optical waveguide for accepting input light and outputting amplified light;
   a gain medium comprising a plurality of adjoining semiconductor layers to provide optical gain, wherein the adjoining semiconductor layers include a first layer and a second layer, the second layer having a different material composition than the first semiconductor layer; and electrodes to pump electric current through the gain medium;

wherein the plurality of adjoining semiconductor layers define one or more quantum wells for electrons and are operative to provide both direct and indirect electron-hole transitions in the gain medium;

wherein a first quantized electron energy level in the conduction band is located in the first layer;

wherein a first quantized hole energy level in the valence band is located in said first layer;

wherein a further first quantized hole energy level in the valence band is located in the second layer;

wherein the first quantized hole energy level in the first layer is either a light hole state or a heavy hole state and the further first quantized hole energy level in the second layer is a different hole state to the first quantized hole energy level in the first layer; and wherein the first layer comprises one of the wells and the second layer comprises a barrier for the electrons, and the heavy hole energy level and the light hole energy level diverge in the first layer.

2. The optical amplifier as claimed in claim 1, wherein the second layer comprises $In_{1-x-y}Al_xGa_yAs$ (x>0, y>0).

3. The optical amplifier as claimed in claim 1, wherein the gain medium has a first modal confinement factor (MCI) for a first optical polarization and a second modal confinement factor (MC2) for a second optical polarization; and wherein the product of MCI and the gain from transitions between the first quantized electron energy level in the conduction band of the first layer and the first quantized hole energy level in the valence band of the first layer is matched to within 20% of the product of MC2 and the gain from transitions between the first quantized electron energy level in the conduction band of the first layer and the further first quantized hole energy level in the valence band of the second layer.

4. The optical amplifier as claimed in claim 1, wherein the first layer is tensile strained.

5. The optical amplifier as claimed in claim 2, wherein the second layer comprises $In_{1-x-y}Al_xGa_yAs$ (0<x<=0.4, 0<y<0.6).

6. The optical amplifier as claimed in claim 2, wherein the first layer comprises $In_{1-x-y}Al_xGa_yAs$ (x=>0, y>0).

7. The optical amplifier as claimed in claim 6, wherein the first layer comprises $In_{1-x-y}Al_xGa_yAs$ (0<=x<=0.4) (0<y<0.6).

8. The optical amplifier as claimed in claim 4, wherein first layer is tensile strained between and including 0.5% and 2%.

9. The optical amplifier as claimed in claim 2, wherein the second layer is strained between 0.3% tensile strain and 0.3% compressive strain.

10. The optical amplifier as claimed in claim 1, wherein the gain medium width is between and including 1 μm to 5 μm.

11. The optical amplifier as claimed in claim 1, wherein the gain medium width is between and including 1 μm to 2 μm.

12. The optical amplifier as claimed in claim 1, wherein the gain medium thickness is between and including 0.1 μm to 0.2 μm.

13. The optical amplifier as claimed in claim 1, wherein the first layer comprises a thickness between and including 2 nm to 15 nm.

14. The optical amplifier as claimed in claim 1, wherein the second layer comprises a thickness between and including 2 nm to 15 nm.

15. The optical amplifier as claimed in claim 1, wherein the second layer comprises a thickness below 10 nm.

16. The optical amplifier as claimed in claim 1, wherein there are 'n' first layers and 'n±1' second layers, where n is a real number.

17. A device comprising a gain medium, the gain medium comprising a plurality of adjoining semiconductor layers to provide optical gain;

wherein the adjoining semiconductor layers define one or more quantum wells for electrons and are operative to provide both direct and indirect electron-hole transitions in the gain medium;

wherein a first quantized electron energy level in the conduction band is located in a first layer;

wherein a first quantized hole energy level in the valence band is located in said first layer;

wherein a further first quantized hole energy level in the valence band is located in an adjacent second layer, and the second layer has a different material composition to the first layer;

wherein the first quantized hole energy level in the first layer is either a light hole state or a heavy hole state and the further first quantized hole energy level in the second layer is a different hole state to the first quantized hole energy level in the first layer;

wherein the second layer comprises $In_{1-x-y}Al_xGa_yAs$ (x>0, y>0); and wherein the first layer comprises a well and the second layer comprises a barrier for the electrons, and the heavy hole energy level and the light hole energy level diverge in the first layer.

18. The device as claimed in claim 17, wherein the first layer is tensile strained.

19. The device as claimed in claim 17, wherein the second layer comprises $In_{1-x-y}Al_xGa_yAs$ (0<x<=0.4, 0<y<0.6).

20. The device as claimed in claim 17, wherein the first layer and the second layer form a composite quantum well sandwiched between further barrier layers, the further barrier layers having a different material composition than the first and second layers of the composite quantum well.

21. The device as claimed in claim 20, wherein each further barrier layer comprises $In_{1-x-y}Al_xGa_yAs$ (0<x<=0.48, 0<y<0.6).

* * * * *